(12) United States Patent
Eberlein

(10) Patent No.: US 6,940,294 B2
(45) Date of Patent: Sep. 6, 2005

(54) METHOD AND CIRCUIT FOR COMPENSATING MOSFET CAPACITANCE VARIATIONS IN INTEGRATED CIRCUITS

(75) Inventor: Matthias Eberlein, Gilching (DE)

(73) Assignee: Dialog Semiconductor GmbH, Kircheim|Teck-Nabern (DE)

( * ) Notice: Subject to any disclaimer, the term of this patent is extended or adjusted under 35 U.S.C. 154(b) by 0 days.

(21) Appl. No.: 10/871,679

(22) Filed: Jun. 16, 2004

(65) Prior Publication Data

US 2004/0227528 A1 Nov. 18, 2004

Related U.S. Application Data

(62) Division of application No. 10/119,924, filed on Apr. 10, 2002, now Pat. No. 6,774,644.

(30) Foreign Application Priority Data

Apr. 2, 2002 (EP) .............................................. 02392007

(51) Int. Cl.[7] .............................................. G01R 27/26
(52) U.S. Cl. ......................... 324/682; 324/678; 324/679
(58) Field of Search ................................ 324/677–679, 324/682, 683, 76.52, 76.77, 76.79; 331/111, 176

(56) References Cited

U.S. PATENT DOCUMENTS

| | | | |
|---|---|---|---|
| 4,623,851 A | 11/1986 | Abou .......................... 331/111 |
| 4,667,168 A * | 5/1987 | Shiomi et al. ............... 331/1 R |
| 5,585,765 A | 12/1996 | D'Shaughnessy ........... 331/111 |
| 5,801,411 A | 9/1998 | Klughart ...................... 257/296 |
| 6,020,792 A | 2/2000 | Nolan et al. ................. 331/111 |
| 6,028,488 A | 2/2000 | Landman et al. ........... 331/1 A |
| 6,157,270 A | 12/2000 | Tso ............................. 331/176 |

OTHER PUBLICATIONS

W.M. Sansen et al., IEEE Journal of Solid State Circuits, vol. 23, No. 3, Jun. 1988, pp. 821–824.

* cited by examiner

*Primary Examiner*—Anjan Deb
*Assistant Examiner*—Timothy J. Dole
(74) *Attorney, Agent, or Firm*—George D. Saile; Stephen B. Ackerman

(57) ABSTRACT

A method for tracking the MOS oxide thickness by the native threshold voltage of a "native" MOS transistor without channel implantation for the purpose of compensating MOS capacitance variations is achieved. The invention makes use of the fact that in MOS devices the threshold voltage is proportionally correlated to the oxide thickness of said MOS device. The threshold voltage can therefore be used to build a reference voltage $V_x + V_{th}$ which accurately tracks the MOS capacitance variations in integrated circuits. Circuits are achieved to create a frequency reference and a capacitance reference using said method Additionally a method is introduced to create a capacitance reference in integrated circuits using said MOSFET capacitors.

8 Claims, 4 Drawing Sheets

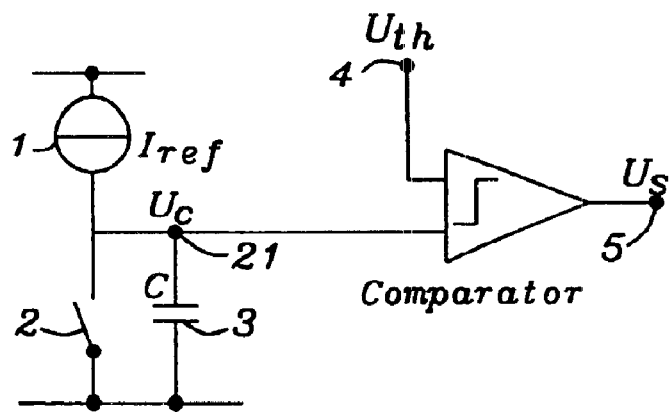
FIG. 1 - Prior Art
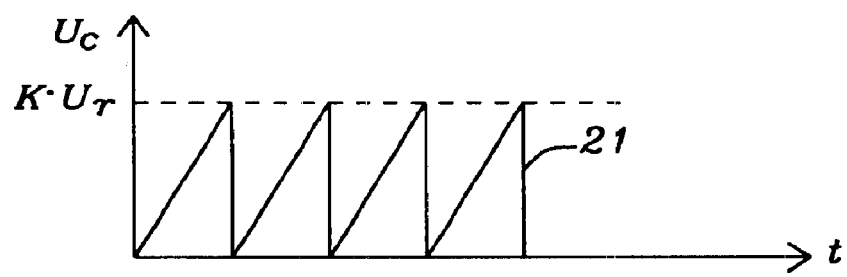
FIG. 2 - Prior Art
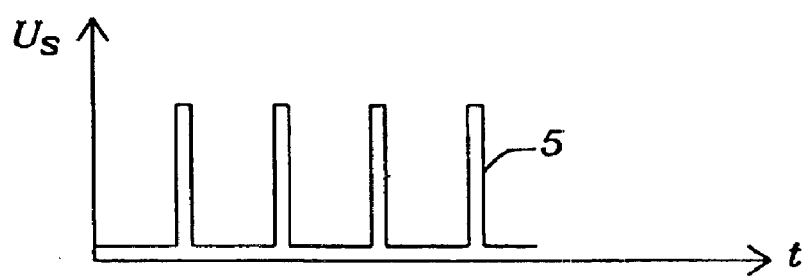
FIG. 3 - Prior Art

METHOD AND CIRCUIT FOR COMPENSATING MOSFET CAPACITANCE VARIATIONS IN INTEGRATED CIRCUITS

CROSS-REFERENCE TO RELATED APPLICATIONS

This application is a divisional of U.S. patent application Ser. No. 10/119,924 filed on Apr. 10, 2002 now U.S. Pat. No. 6,774,644.

BACKGROUND OF THE INVENTION (1) Field of the Invention

This invention relates generally to integrated circuits requiring accurate capacitance values. Specifically, the present invention introduces a method to use MOS devices as stable capacitors and comprises a method and circuits used for compensating capacitance variances of said MOS capacitors in integrated circuits in applications as oscillators, frequency references and capacitance references and a method to build capacitance references in integrated circuits.

(2) Description of the Prior Art

The capacitance of available capacitors in integrated circuits is varying more than 10% to 25%. Due to said variance of the capacitance applications requiring an accurate value of capacitance, as e.g. a suitable frequency reference cannot be implemented efficiently in integrated circuits. Therefore in integrated circuits said problems are solved in prior art by trimming e.g. an oscillator using fuses which is expensive and consuming tester time.

Typical applications where accurate values of capacitance are required are e.g. oscillators. Oscillators are circuits for convening dc power into a periodic wave-form or signal. Conventional RC oscillators advantageously furnish a low-cost timing source and allow for generation of variable frequencies by changing the resistance R, or capacitance C. Furthermore, conventional RC oscillators avoid advantageously the use of inductors, which are difficult to fabricate in integrated circuits.

Normally an RC relaxation oscillator needs a precision resistor R and also a precision capacitor C to achieve an accurate time constant $T=R\times C$. Since both devices vary by 10–25% in integrated circuit fabrication an expensive trimming scheme or external components must be used for such a frequency reference. FIG. 1 prior art shows as example the principle of such a relaxation oscillator. Said RC oscillator comprises the current source 1 with a current $$Iref = \frac{Ur}{R},$$

a periodical switch 2, a capacitor 3 having the capacitance C, a comparator 4 having as input the voltage $U_c$ 21 at the capacitor C 3 and the threshold voltage $U_{th}$ 4 and as output the voltage $U_s$ 5. Said threshold voltage is proportional to the reference voltage $U_r$.

$$U_{th} = k \times U_r$$

The principle is to charge a capacitor with a current $I_{ref}$ proportional to said reference voltage $U_r$. If the resulting voltage at the capacitor C 3 exceeds said threshold voltage $U_{th}$ 4 a pulse or digital signal is created at the circuit output $U_s$ 5. Afterwards said capacitor C 3 is discharged/charged with the same current in order to initiate another switching event after a certain time which is defined by the switch 2. This is repeated continuously and periodically and therefore creates a constant frequency at the circuit output $U_s$ 5. FIG. 2 prior art shows the voltage $U_c$ 21 at the capacitor C 3 (shown in FIG. 1 prior art) and FIG. 3 prior art shows the voltage at the circuit output $U_s$ 5.

The frequency f of said oscillator follows the formula $$f = \frac{Iref}{2 \times k \times Ur \times C} = \frac{1}{2 \times k \times C \times R}$$

It is obvious that the accuracy of the values of the resistor R and the capacity C have a direct impact to the frequency of said oscillator. Variations in the order of magnitude of 25% are not acceptable for most applications.

U.S. Pat. No. (6,020,792 to Nolan et al.) describes a precision relaxation oscillator with temperature compensation. The precision relaxation oscillator is comprised of an oscillation generator comprised of a set-reset flip-flop and other components, a first current generator for producing a first output current and a second current generator for producing a second output current. The invention is implemented on a single, monolithic integrated circuit.

U.S. Pat. No. (5,801,411 to Klughart) discloses an integrated capacitor structure having substantially reduced temperature and voltage coefficients including a combination of conventional N-depletion and P-depletion MOS gate capacitors connected in parallel and optimized for use at low bias voltages, where both the N-depletion and P-depletion capacitor structures have substantially zero temperature coefficients in their fully depleted region of operation.

U.S. Pat. No. (5,585,765 to O'Shaughnessy) shows a low power RC oscillator including a low power bias circuit and an RC network. The RC network is used to form a time constant equal to the RC product. The RC oscillator includes a separate oscillator, such as a voltage-controlled oscillator (VCO), and uses the RC time constant to compare with the oscillator-generated period and to adjust the frequency of the overall RC oscillator circuit in accordance with the comparison. The RC oscillator is self-calibrating.

W. M. Sansen et al. (IEEE Journal of Solid State Circuits, Vol. 23, No. 3, June 1988) describe a temperature-compensated current reference for CMOS integrated circuits, based upon a MOSFET as current defining element. So as to minimize the mass production cost, it uses no external components nor trimming procedures. Comparison with classical current reference with a resistor as a current defining element shows a considerable improvement of the relative tolerances of the current.

SUMMARY OF THE INVENTION

A principal object of the present invention is to provide a method for compensating the variations of the capacitance of capacitors in integrated circuits.

A further object of the present invention is to achieve a frequency reference with MOS capacitors in integrated circuits.

Another further object is to achieve a capacitance reference using MOSFET capacitors in integrated circuits.

Another further object of the invention is to achieve a method to create a reference capacitor using an RC oscillator and a MOSFET capacitor in integrated circuits.

In accordance with the objects of this invention a method for tracking the MOS oxide thickness by the native threshold voltage $V_{th}$ of a "native" MOS transistor for the purpose of compensating MOS capacitance variations is achieved. Said method comprises, first, providing a MOS transistor having a native threshold voltage $V_{th}$. The first step is to sense the native threshold voltage Vth of said native MOS transistor, followed by building a suitable reference voltage level by adding by a circuit means another constant voltage $V_x$, then charging a MOS capacitor built out of a native MOS transistor up to the reference level $V_{ref}=V_x+V_{th}$ and finally measure a capacitance related value in a suitable configuration for oscillators which depends now no more on the oxide thickness.

In accordance with the objects of this invention a circuit for a frequency reference in an integrated circuit using a MOSFET as a stable capacitor is achieved. Said circuit, first, is comprising a constant current source, switching means charging and discharging said MOSFET capacitor being activated periodically by the output of comparing means charging and discharging said MOSFET capacitor. Furthermore said circuit is comprising comparing means having an input and an output wherein the input is the voltage of said capacitor and a voltage exceeding the threshold voltage of said MOSFET to influence the frequency and the amplitude of the output of said comparing means and the output is a periodical pulse. Furthermore the circuit comprises a MOSFET capacitor being charged/discharged periodically by said constant current source and its voltage level being the input to said comparing means and its threshold voltage is used to compensate the variations of capacitance, means to provide a voltage exceeding the threshold voltage of said MOSFET to influence the frequency and the amplitude of the output of said comparing means, and means to transform the periodical pulse into an alternating clock signal to drive said switching means and being the output of said frequency reference circuit.

In accordance to further objects of the invention a circuit to use a MOSFET capacitor as a reference capacitor in an integrated circuit is achieved. Said circuit, first, is comprising an RC-oscillator circuit having an input and an output wherein the input is a current source and a signal from a phase detector regulating the capacitance of said RC oscillator and the output is a periodical signal, a frequency reference circuit having an input and an output wherein the input is a current source and the output is a periodical signal and a phase detector circuit having an input and an output wherein the input are the periodical output signals from said RC oscillator and from said frequency reference and the output is a signal to regulate the capacitance of the RC oscillator and the capacitance of the capacitor to become a reference capacitor and said capacitor to become a reference capacitor.

In accordance to further objects of the invention a method for creating a capacitance reference in integrated circuits is achieved said method is comprising, first, providing an RC oscillator circuit, a constant current source, a frequency reference, a phase detector and a capacitor to become a reference capacitor. The first step is generating with said RC oscillator circuit a periodic signal with frequency $f_1$ followed by generating with said frequency reference-circuit a signal with frequency $f_2$, then comparing said frequency $f_1$ and frequency $f_2$ and regulating the capacitance of the capacitor of said RC oscillator until $f_1$ equals $f_2$, calculate the capacitance of the reference capacitor using an equation and use the calculated capacitance for a reference capacitor.

BRIEF DESCRIPTION OF THE DRAWINGS

In the accompanying drawings forming a material part of this description, there is shown:

FIG. 1 prior art illustrates a block diagram of the principle of an RC oscillator.

FIG. 2 prior art is a time chart of the voltage at the capacitor side of an RC oscillator.

FIG. 3 prior art is a time chart of the voltage at the output of an RC oscillator.

DESCRIPTION OF THE PREFERRED EMBODIMENTS

The preferred embodiments disclose methods and novel circuits to compensate the variations of the capacitance of MOS capacitors and to achieve frequency references and capacity references using MOS capacitors in integrated circuits. The invention avoids the costly trimming of capacitors in integrated circuits as performed in prior art.

Figure 4:
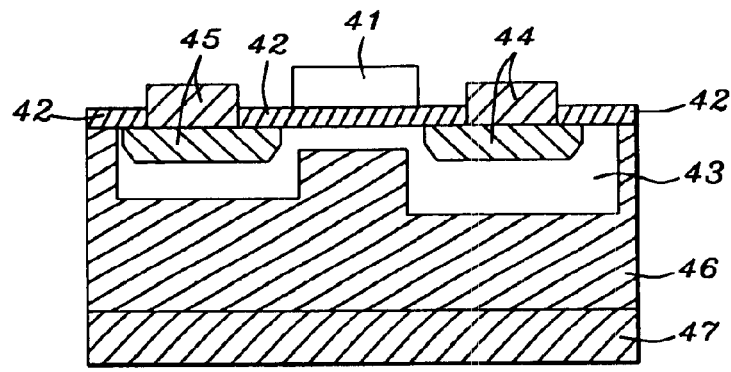
FIG. 4 shows a principal layout of a MOSFET.

FIG. 4 shows the basic structure of a n-type Metal-Oxide-Semiconductor field-Effect-Transistor(MOSFET). It consists of a source 45, a drain 44, two highly conducting n-type semiconductor regions which are isolated from the p-type substrate 46 by reversed biased p-n diodes. Between the p-type substrate 46 on one side and the drain 44 and the gate 45 on the other side is a depletion layer 43. A metal(or polycrystalline) gate 41 covers the region between source and drain, but is separated from the semiconductor by the gate oxide 42. The back contact is signified with 47. Said gate oxide 42 blocks any carrier flow and has therefore a capacitance. The thickness $T_{ox}$ of the gate oxide is in the order of magnitude between about 30 to 150 angstrom. If a bias voltage is applied to the gate metal, relative to the silicon substrate, in excess of the threshold voltage then charge carriers are gathered in sufficient concentration under the gate oxide 42.

It is known by those skilled in art that the "native" threshold voltage $V_{th}$ of MOS devices is proportionally correlated to the variation of the oxide thickness $T_{ox}$ of said transistors. A "native" MOS device, which is used in the invention, is actually an MOS device without channel implantation. The implantation normally adjusts the threshold voltage $V_{th}$ to the desired value. But without such "correction" said threshold voltage $V_{th}$ is directly related to the oxide thickness of said MOS device and furthermore the gate capacitance of said transistor is proportionally related to its oxide thickness $T_{ox}$. Therefore a linear correlation between said "native" threshold voltage and the gate capacitance of said MOS device exists. This has been proven by spectroscopy techniques measuring the oxide thickness and the gate capacitance. The invention proposes to use said "native" MOS device, this means MOS devices without any channel implantation, as capacitors in integrated circuits. The capacitance of the oxide layer of said native MOSFET relates to $$C(\text{oxide}) = \frac{a}{T_{ox}}$$

and
the threshold voltage relates to $$V_{th}=b+c\times T_{ox}.$$

$T_{ox}$ is the oxide thickness, a, b and c are physical constants or doping values which are assumed to be fix or at least accurately predictable. After said threshold voltage $V_{th}$ is sensed it can be used build a reference voltage $$V_{ref} = V_x + V_{th}$$

which accurately tracks the capacitance variations of said MOS device in integrated circuits such as e.g. oscillators. The value of $V_x$ is chosen to achieve a proper compensation, in the preferred embodiment $V_x = -b$, wherein b is the physical constant mentioned above in the equation to define $V_{th}$.

Said reference voltage $V_{ref} = V_x + V_{th}$ plays the role of the reference voltage $k \times U_r$ shown in the prior art FIGS. 1 and 2. Therefore a suitable voltage $V_x$ can be defined such that the reference voltage $V_{ref}$ effectively compensates the impact of the variation of the oxide thickness $T_{ox}$ on the output frequency of such an oscillator so that the remaining frequency stays independent of said oxide thickness variations. Any decrease of $T_{ox}$, for example, which would increase the capacitance C and decrease the frequency f results also in a decrease of the threshold voltage $V_{th}$ and the related reference voltage $V_{ref} = V_x + V_{th}$ and compensates the frequency variation caused by the change of the oxide thickness.

Figure 8:
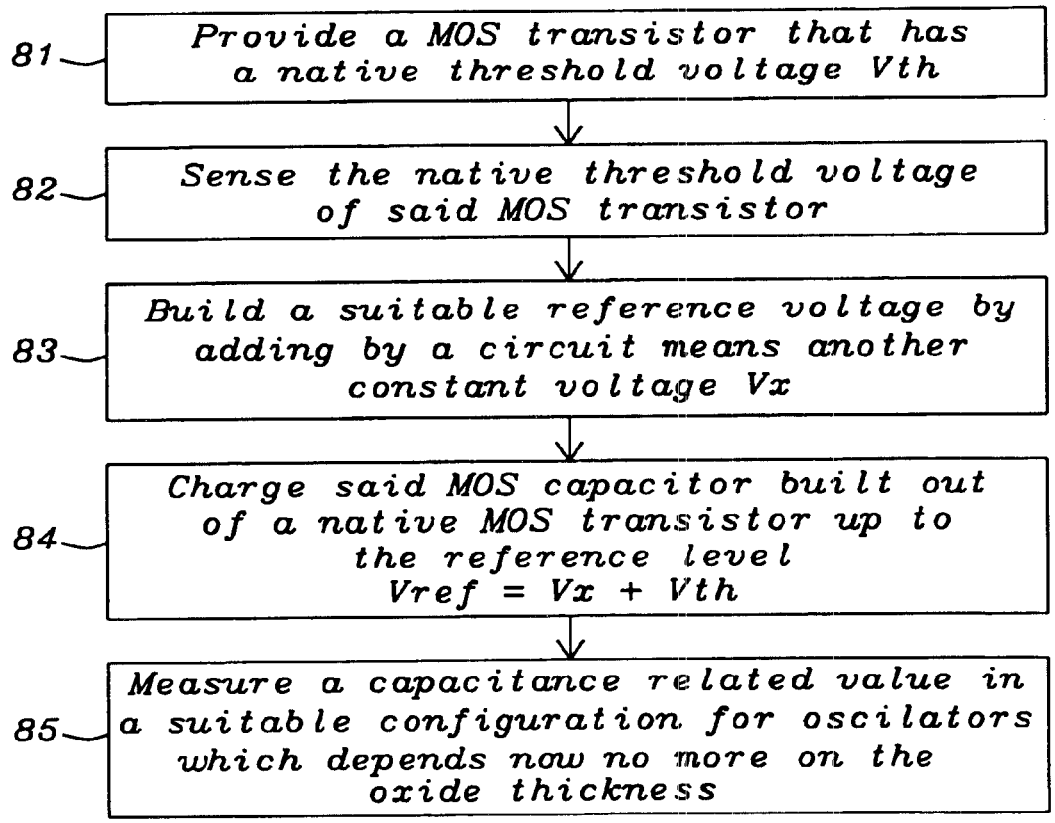
FIG. 8 shows a flowchart illustrating a method how to track MOS oxide thickness by a native threshold voltage.

FIG. 8 illustrates a method for tracking MOS thickness by said "native" threshold voltage $V_{th}$ of a "native" MOS device for the purpose of compensating MOS capacitance variations. The first step 81 shows that a native MOS device without channel implantation has to be provided. In step 82 the "native" threshold voltage $V_{th}$ is sensed In the next step 83 a suitable reference voltage $V_{ref} = V_x + V_{th}$ is built by adding the constant voltage $V_x$ to the threshold voltage $V_{th}$. Said MOS capacitor is charged up to said reference level $V_{ref} = V_x + V_{th}$ in step 84. Step 85 illustrates that a capacitance related value as e.g. the charging time of said MOS capacitor or the resulting frequency of a suitable configuration as e.g. a feedback configuration or a repeating configuration is measured. Said capacitance related value can be e.g. the charging time or the resulting frequency. The charging time depends on the oxide thickness, since this determines the capacitance, and also on the reference voltage. Both influences compensate each other in optimized conditions.

Another advantage of said invention is that the impact of changes of the supply voltage Ur to the frequency f is very small. $V_x$ is usually much greater than said threshold voltage $V_{th}$. Therefore, if $V_x$ is derived from the supply voltage $U_r$, the resulting frequency f is in first order independent of $U_r$, since the current source $I_{ref}$ also tracks any $U_r$ variations.

Figure 5:
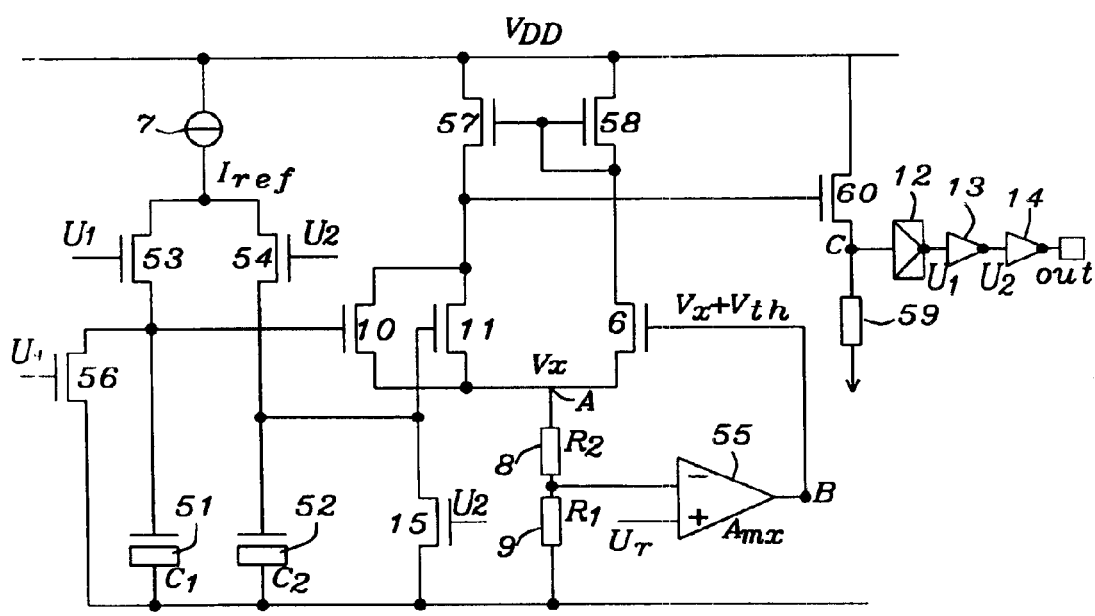
FIG. 5 shows the principal components of a circuit of a frequency reference using MOSFET capacitors.

The usage of such a MOS capacitor presented is especially suitable to build a frequency reference together with an external precision resistor. FIG. 5 shows an example of a circuit that can perform said method of tracking MOS oxide thickness by the native threshold voltage of a "native" MOS device for the purpose of compensating MOS capacitance variations. In said circuit the required comparator and the voltage addition $V_{ref} = V_x + V_{th}$ within the same building block is realized.

The circuit is comprising two said "native" MOSFET capacitors 51 and 52 which are switched by the clock signals Φ1 and Φ2. Said two MOSFET capacitors as all other transistors of the circuit are "native" transistors, this means without channel implantation. The related switches for the frequency Φ1 are the transistors 53 and 56, the switches for the frequency Φ2 are the transistors 54 and 15. Said clock signals are inverted to each other, therefore one of the two said capacitors is always connected to zero while the other while the other gets charged during one half time period.

The amplifier 55 is connected through the transistor 6 and the voltage divider consisting of the resistors R1 8 and R2 9 in a simple feedback configuration. It regulates the voltage at node "A" to the value:

$$Vx = \frac{Ur \times (R2 + R1)}{R1}.$$

(Therefore $V_x$ can be accurately generated. In this context said transistor 6 operates as a voltage follower.

Additionally said transistor 6 forms the input of a comparator comprising the pair of transistors 10 and 11 and additionally the transistors 57 and 58 form a current mirror to complete said comparator built as a differential amplifier. Since the MOSFET capacitors 51 and 52 are switched alternatively either transistor 10 or 11 is active at the same time. Because of the source follower operation of transistor 6 in connection with the amplifier 55 the voltage at node "B" is exactly $V_{ref} = V_x + V_{th}$. Now if "native" NMOS technology is chosen for transistors 6, 10, 11 then $V_{ref}$ forms a suitable reference level which is connected to the capacitor input of said comparator.

Therefore said comparator generates a short positive pulse through transistor 60 at output node "C" as soon as the capacitor voltage at the input of said comparator exceeds $V_{ref}$. The resistor 59 represents a current source. The toggle flip-flop (T-FF) 12 transforms the positive pulses into alternating clock signals which in turn switches the MOSFET capacitors 51 and 52. The two inverters 13 and 14 are inverting the clock signals Φ1 and Φ2.

Figure 6:
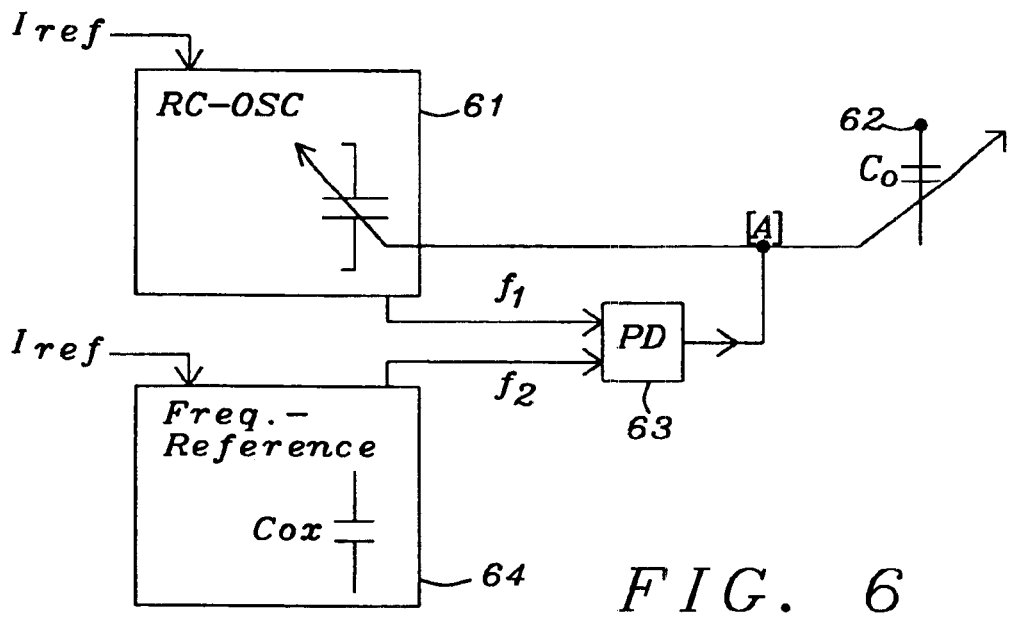
FIG. 6 illustrates a block diagram of a circuit of a capacitance reference

Further the presented invention with said RC oscillator can be used to create a capacitor reference. Since the resulting frequency, according to the given equations, only depends on $U_r$, R and on physical constants, an equivalent capacitance can be calculated. This would be independent of the resistor R and can therefore be fabricated with high accuracy in an IC manufacturing process. FIG. 6 illustrates how a capacitor reference can be implemented by combining an RC oscillator 61, as shown in FIG. 1 prior art, with the frequency reference 64 shown in FIG. 5 in detail. The output frequency of the RC-oscillator 61 is $f_1$. The output frequency of the frequency reference 64 is $f_2$. The capacitor in the RC-oscillator 61 must be of the same type as the capacitor $C_0$ which is to become a reference capacitor and will be trimmed therefore. From the given equation results $$f_1 = \frac{1}{2 \times k \times C1 \times R},$$

$$f_2 = \frac{Ur}{2 \times (Vx + Vth) \times Cox \times R} = \frac{Ur \times Tox}{2 \times a \times R \times (Vx + b + c \times Tox)}.$$

choosing e.g. $V_x = -b$ to compensate the capacitance variations results in:

$$f_2 = \frac{Ur}{2 \times R \times a \times c}.$$

In above equations a, b and c are the same physical constants or doping values as mentioned earlier in the equations for C(oxide) and for the threshold voltage $V_{th}$.

Now $f_1$ and $f_2$ can be compared with a "phase detector" PD 63 which regulates in a feedback loop capacitor $C_1$ in the RC oscillator 61 such that $f_1$ equals $f_2$. The regulation is done by switching parts of $C_1$ "on" and "off" implemented preferably by MOS switches. Said condition "$f_1$ equals $f_2$" is true If the clock edges of the signals $f_1$ and $f_2$ are synchronized. Any types of capacitors can be used for $C_1$ and $C_0$. $C_0$ always, independent of $f_1$ or $f_2$ equals $C_1$ since it is matched in the circuit.

In the said state of equilibrium of $f_1$ and $f_2$ the equations are valid:

$$\frac{Ur}{2 \times R \times a \times c} = \frac{1}{2 \times k \times R \times C_1}$$

and $$C_1 = C_0 = \frac{a \times c}{Ur \times k}.$$

With the help of above mentioned equation the capacitance of the capacitor $C_0$ can be calculated and $C_0$ can be used as a reference capacitor.

If the same output signal of the "phase detector" 61 at node "A" drives the reference capacitor $C_0$ as well as the capacitor $C_1$ said reference capacitor gets very much predictable and accurate. The parameters a, c and k are physical constants or integer numbers, the voltage Ur can easily be generated accurately in integrated circuits.

Figure 7:
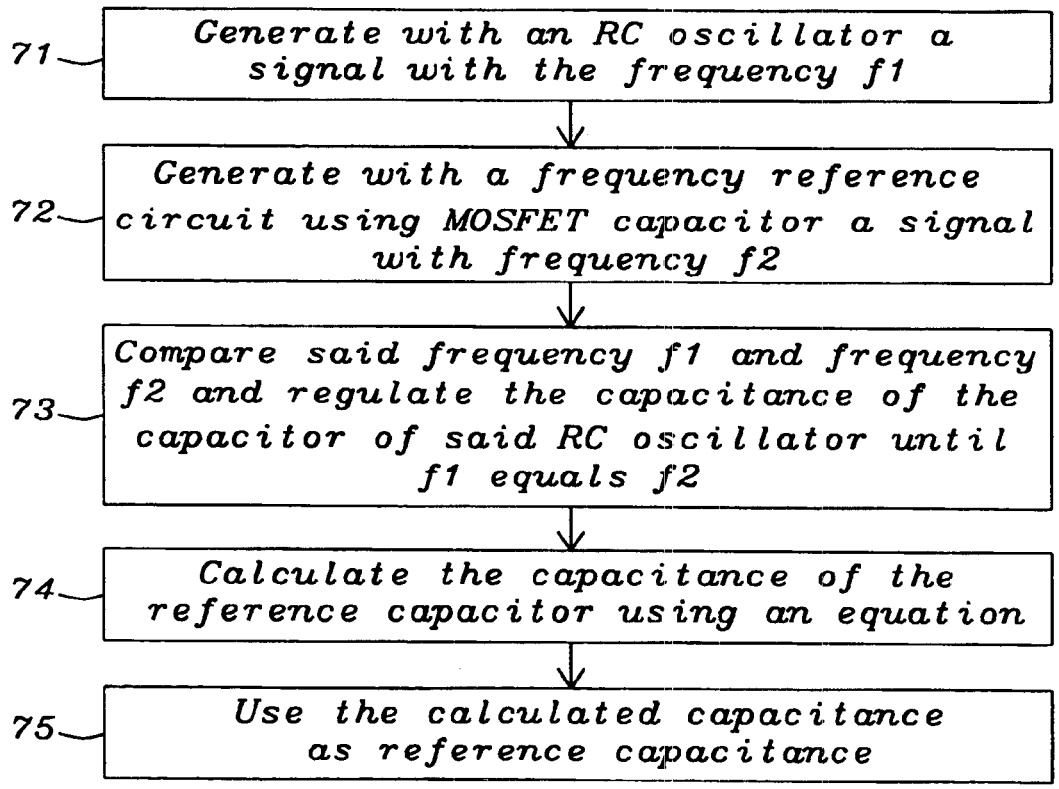
FIG. 7 shows a flowchart of the method how to a achieve a reference capacity using a MOSFET capacitor.

FIG. 7 shows using a flowchart a summary of the method to create a capacitor reference. The steps 71 and 72 illustrate that the RC oscillator 61 is generating a frequency $f_1$ and the frequency reference 64 is generating a frequency $f_2$. Step 73 illustrates that a phase detector 63 compares said frequencies $f_1$ and $f_2$ and regulates the capacitance of the capacitor of said RC oscillator 61 until $f_1$ equals $f_2$. Both frequency generators and the phase detector are shown in FIG. 6. In the next step 74 the capacitance of the reference capacitor is calculated using the above mentioned equation. The reference capacitor can be used now having the calculated capacitance.

While the invention has been particularly shown and described with reference to the preferred embodiments thereof, it will be understood by those skilled in the art that various changes in form and details may be made without departing from the spirit and scope of the invention.

What is claimed is:

1. A circuit to use a MOSFET capacitor as a reference capacitor in an integrated circuit comprising:

an RC-oscillator circuit having an input and an output wherein the input is a current source and a signal from a phase detector regulating the capacitance of said RC oscillator and the output is a periodical signal;

a frequency reference circuit having an input and an output wherein the input is a current source and the output is a periodical signal and wherein said frequency reference circuit is comprising:

a constant current source;

switching means charging and discharging said MOSFET capacitors being activated periodically by the output of comparing means and charging and discharging said MOSFET capacitor;

comparing means having an input and an output wherein the input is the voltage of said MOSFET capacitor and a voltage exceeding the threshold voltage of said MOSFET to influence the frequency and the amplitude of the output of said comparing means and the output is a periodical pulse;

a MOSFET capacitor being charged and discharged periodically by said constant current source and its voltage level being the input to said comparing means and its threshold voltage is used to compensate the variations of its capacitance;

means to provide a voltage exceeding the threshold voltage of said MOSFET to influence the frequency and the amplitude of the output of said comparing means; and means to transform the periodical pulse into an alternating clock signal to drive said switching means and being the output of said frequency reference circuit;

a phase detector circuit having an input and an output wherein the input are the periodical output signals from said RC oscillator and from said frequency reference and the output is a signal to regulate the capacitance of the RC oscillator and the capacitance of a capacitor to become a reference capacitor; and said capacitor to become a reference capacitor.

2. The circuit of claim 1 wherein said switching means are transistors.

3. The circuit of claim 1 wherein said stable current source is using a reference voltage and an resistor external to the integrated circuit.

4. The circuit of claim 1 wherein said comparing means are a pair of transistors.

5. The circuit of claim 1 wherein said MOSFET capacitor is a pair of MOSFETs which are alternating charged and discharged.

6. The circuit of claim 1 wherein said means to provide a voltage exceeding the threshold voltage of said MOSFET to influence the frequency and the amplitude of the output of said comparing means are a voltage divider and an amplifier having an input and an output wherein the input is the output of said voltage divider and a reference voltage and the output is said voltage as input of said comparing means.

7. The circuit of claim 1 wherein the said capacitor is a pair of MOSFETs.

8. The circuit of claim 1 wherein a flip-flop circuit and inverters are used to transform the output pulses of the comparing means into alternating clock signals being the input to said switching means forming the output of said frequency reference circuit.

* * * * *